United States Patent [19]

Tsutsui et al.

[11] 4,273,812
[45] Jun. 16, 1981

[54] METHOD OF PRODUCING MATERIAL PATTERNS BY EVAPORATING MATERIAL THROUGH A PERFORATED MASK HAVING A REINFORCING BRIDGE

[75] Inventors: Ken Tsutsui, Hachioji; Akira Sasano, Hinodemachi; Toshio Nakano, Hinodemachi; Haruo Matsumaru, Hinodemachi; Eiichi Maruyama, Kodaira, all of Japan

[73] Assignees: Hitachi, Ltd.; Hitachi Denshi Kabushiki Kaisha, both of Tokyo, Japan

[21] Appl. No.: 8,587

[22] Filed: Feb. 1, 1979

[30] Foreign Application Priority Data

Feb. 1, 1978 [JP] Japan .................................. 53/9263

[51] Int. Cl.³ .................... H05K 3/10; C23C 13/00; C23C 13/02
[52] U.S. Cl. ................................. 427/248.1; 118/504; 427/99; 427/250; 427/251; 427/255; 427/255.5; 427/255.7; 427/282; 427/68; 427/124
[58] Field of Search ............... 427/99, 282, 248 G, 427/250, 251, 255, 248.1, 255.5, 255.7, 124; 118/504

[56] References Cited

U.S. PATENT DOCUMENTS

| | | |
|---|---|---|
| 3,148,085 | 9/1964 | Wiegmann . |
| 3,193,408 | 7/1965 | Triller ................................. 118/504 |
| 3,326,718 | 6/1967 | Dill ..................................... 427/282 |
| 3,510,349 | 5/1970 | Jones ................................... 427/99 |
| 3,799,792 | 3/1974 | Ryng ................................... 427/282 |
| 4,049,857 | 9/1977 | Hammer .............................. 427/99 |

FOREIGN PATENT DOCUMENTS 978984 1/1965 United Kingdom ...................... 427/99

OTHER PUBLICATIONS

Ames, "Circuit Fabrication", IBM TDB vol. 5, No. 9, Feb. 1963 p. 10.
Byrne, "Mask Design for Complex Pattern Paste Application" IBM TDB vol. 18, No. 4, Sep. 1975 p. 1035.

Primary Examiner—John D. Smith
Attorney, Agent, or Firm—Craig and Antonelli

[57] ABSTRACT

A method of producing material patterns in which at least one substrate is fixed together with a mask to a substrate holder, and an evaporated film of desired substances is formed on the surface of the substrate by means of evaporation sources provided to confront the substrate. The mask is fabricated to have a plurality of reinforcing bridges formed in the desired portions of the mask openings of desired shape formed in the mask. The mask is held spaced from the substrate by a small distance during the evaporation, so that the evaporation may be effected at least through two pattern openings defined at both sides of each bridge. The evaporation is performed by means of evaporation sources which are located such that the line interconnecting one of the edges of each bridge and the evaporation source located at the same side with respect to the substantial bridging direction of the bridge and another line interconnecting the other edge of the bridge and the evaporation source located at the same side as the other edge intersect each other at a point on the surface of the substrate or in the clearance between the substrate surface and the mask. This method makes it possible to produce patterns which could never be produced by the conventional evaporation method.

17 Claims, 18 Drawing Figures

METHOD OF PRODUCING MATERIAL PATTERNS BY EVAPORATING MATERIAL THROUGH A PERFORATED MASK HAVING A REINFORCING BRIDGE

BACKGROUND OF THE INVENTION

1. Field of the Invention

The present invention relates to a method of producing material patterns which makes use of an evaporation technique and, more particularly, to a method of producing material patterns by evaporated films, applicable to the production of integrated circuits, thin film circuits, thick film circuits and hybrid integrated circuits in which the aforementioned circuits are combined.

2. Description of the Prior Art

Conventionally, the evaporation through mask technique has been used for the production of relatively simple patterns, e.g. square pattern, nearly square but rectangular pattern, circular pattern and so forth.

However, it is impossible to obtain complicated patterns such as those mentioned below by a mere application of the evaporation through mask technique. Hitherto, for obtaining these complicated patterns, it has been necessary to take a plurality of evaporations or to adopt a combination of evaporation and photoetching techniques such that at first a film of uniform thickness is formed by evaporation and then the film is processed by photoetching to form the desired pattern. These complicated patterns include the following:

(1) a rectangular pattern having a length-to-width of more than several tens (referred to as "line", hereinafter). Particularly, a pattern in which a plurality of lines of 1 mm wide or narrower run in close proximity of adjacent ones. (An example of this pattern in shown in FIG. 1a)

Figure 1A:
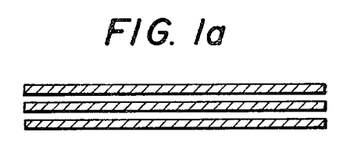
FIGS. 1a,1b,1c and 1d are plan views of patterns which can hardly be formed by evaporation through mask technique.
Figure 1B:
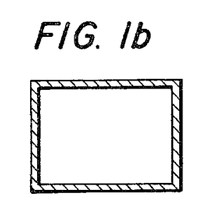
Figure 1C:
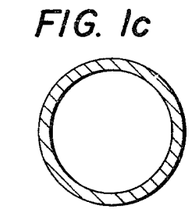

(2) a pattern forming a closed circuit, e.g. a doughnut-like pattern as shown, for example, in FIGS. 1b and 1c.

Figure 1D:
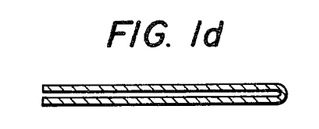

(3) a pattern substantially but not completely in the form of closed circuit, e.g. a hairpin-shaped pattern as shown in FIG. 1d.

Usually, a plate of 50 $\mu$m to 1 mm thick, made of molybdenum, stainless steel or the like material is used as the mask. In case of the pattern as shown in FIG. 1a, it is possible to enhance the mechanical strength of the mask by adopting an increased thickness of the latter. It is impossible, however, to make the clearance between adjacent patterns or pattern width for a given thickness of the mask, because of the reason concerning the mask processing. Thus, in case of the above-listed complicated patterns, it becomes impossible to maintain the mask as plane, as the required pattern clearance and the pattern width becomes smaller. For this reason, in usual cases, the evaporation method has been used only in the production of relatively simple patterns.

SUMMARY OF THE INVENTION

Under this circumstance, the present invention aims as its major object at providing a novel method of producing material patterns, which would afford the production of such patterns as could never be produced by the conventional evaporation method.

To this end, according to the invention, there is provided a method of producing material patterns as will be summarized hereinunder.

Basically, the method of the invention is to produce the pattern on at least one substrate held by a substrate holder, by forming an evaporated film of desired substance on the substrate by means of at least one evaporation source disposed to confront the substrate.

Further, the following technique are used in the method of the invention.

(1) When the pattern is such that the mask cannot maintain itself solely by the mask material, the pattern in the mask is divided into sections by narrow bridges formed at desired portions of the pattern.

(2) Thus, the pattern in the mask has bridges which divide the pattern to be formed on the substrate into sections. It is therefore necessary to recover the portions of the pattern which are hidden behind the bridges. To this end, the mask is positioned slightly above the surface of the substrate. This is generally achieved by making use of spacers of 50 to 150 $\mu$m.

(3) Further, the substrate and the evaporation source are situated in such a predetermined positional relation to each other as to afford deposition of evaporated substance to the portion of the pattern behind the bridges from both sides of each bridge. During the evaporation, the substrate holder may be rotated continuously or intermittently, or, alternatively, kept stationary. In the latter case, it is necessary to use at least two evaporation sources.

The aforementioned positional relation between the substrate and the evaporation source is as follows.

Namely, the evaporation sources are so located in relation to the substrate surface such that the extensions of lines between the evaporation sources and the edges of the bridge intersect each other at a linear point which resides on the surface of the substrate or in the space behind the bridge between the mask and the substrate.

A successful result can be achieved by only one evaporation source, if the substrate is rotated during the evaporation, although the invention does not exclude the use of a plurality of sources even when the substrate is rotated.

In case that the evaporation is effected by only one evaporation source, while rotating the substrate, it is deemed that an imaginary evaporation source is located at a position which is in symmetry with the actual evaporation source with respect to the axis of rotation. Then, the aforementioned requisite is fairly satisfied by these two evaporation sources, i.e. an actual one and an imaginary one.

Needless to say, when a plurality of evaporation sources are used, it is preferred to arrange them linearly. At the same time, it is preferred that the lines interconnecting two mask openings at both sides of respective bridges extend substantially in parallel with one another. The maximum acceptable angular deviation of these lines is about 30°, for obtaining an appreciable effect, although it depends on the shape of the pattern. Thus, when a plurality of evaporation sources are used, it is preferred that the line or lines along which the evaporation sources are disposed and the lines interconnecting the two mask openings at both sides of respective bridges extend substantially in parallel with each other or, if not, these lines intersect at an angle smaller than about 30°. The recovery of the portions of the pattern behind the bridges will be deteriorated if the angle of intersection exceeds 30°. A positional relation equivalent to that described above is required also in the evaporation in which the substrate is rotated.

DESCRIPTION OF THE PREFERRED EMBODIMENTS

Hereinafter, the invention will be described in detail through a specific practical embodiment.

The descripton will be made with reference to the production of a rectangular closed circuit pattern as shown in FIG. 1b, by way of example. Needless to say, the same advantage is obtainable in the production of other patterns.

Figure 2:
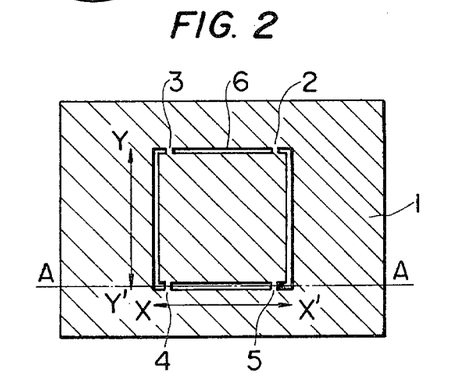
FIG. 2 is a plan view of a mask adapted for the production of a closed-loop pattern.

A mask as shown in FIG. 2 is prepared for the production of the pattern as shown in FIG. 1b. An opening 6 corresponding to the pattern as shown in FIG. 1b is formed in a mask blank 1 which is made of a molybdenum plate of 80 μm thick. The width of the opening 6 is 100 μm, while the length of each side of the same is 10 mm. The opening 6 is divided into sections by means of bridges 2,3,4 and 5. The breadth of each bridge is 50 μm. Thanks to the provision of these bridges, the mask can have a sufficiently large mechanical strength to maintain itself. The arrangement is such that lines connecting two opening sections defined at both sides of respective bridges extend substantially in the same direction. The aforesaid lines of this embodiment extend in the X-X' direction. Each line is, respectively, perpendicular to the substantial bridging direction of each bridge. In this case, the four lines corresponding to four bridge 2,3,4, and 5 extend in the same direction with each other. In some cases, however, it may be impossible to make these lines extend strictly in the same direction, due to the specific form of the pattern. In such a case, the angular deviation of these lines is preferably maintained below 30°.

Figure 3:
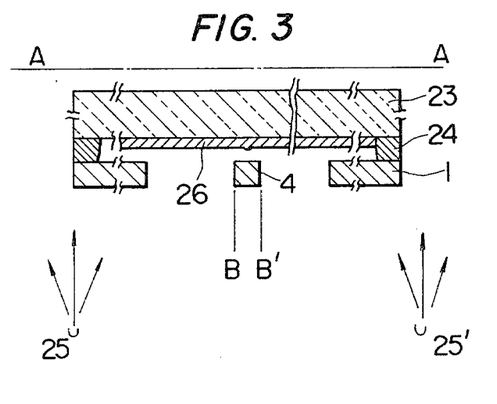
FIG. 3 is an illustration showing the cross section of the mask taken along the line A—A of FIG. 2, as well as an evaporation source.

FIG. 3, which corresponds to the section as taken along the line A—A of FIG. 2, shows the state of the mask and the substrate during the evaporation. In FIG. 3, reference numeral 4 designates one of the bridges, while a pair of evaporation sources 25, 25' are denoted by reference numerals 25,25'. Reference numeral 26 denotes a pattern formed by the evaporated substance. After aligning the mask 1 with the substrate 23 through spacers 24, the assembly is placed in the evaporation machine. Spacers designated at reference numeral 24 have a thickness of 80 μm.

Figure 4:
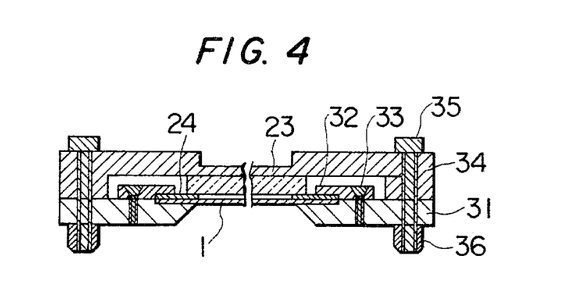
FIG. 4 is an illustration explanatory of a holder.

The substrate 23, spacer 24 and the mask 1 are held in the manner as shown in FIG. 4. More specifically, the mask and the spacers are clamped between a mask holder 31 and a mask fixing plate 32, and are fixed by means of mask fixing screws 33. Then, the substrate 23 is placed above the spacers and is clamped by means of a substrate fixing plate 34. After aligning the substrate and the mask relatively to each other, the combination of the mask and the spacer, and the substrate are fixed by means of substrate fixing screws 35,36.

Figure 5:
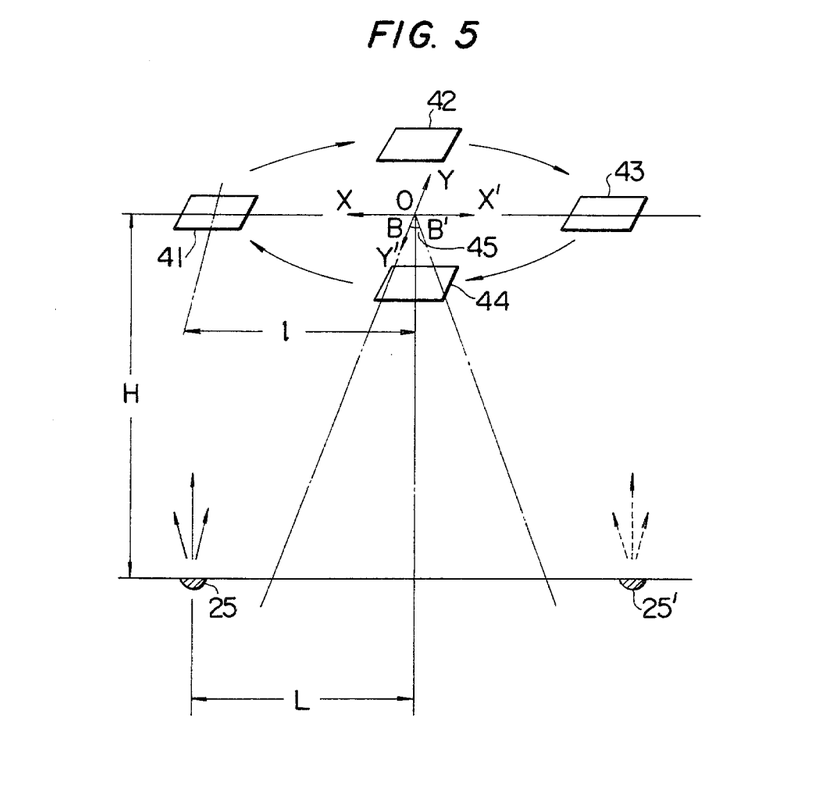
FIG. 5 is an illustration of a model for explaining the pattern producing method in accordance with the invention.

The evaporation is carried out in the manner which is illustrated, by making use of a model in FIG. 5. The substrate onto which the evaporation film is to be formed is mounted on a substrate holder adapted to rotate around an axis O. The sample holder may be such a one as used in conventional rotating evaporation techniques.

The substrate is deviated from the center of rotation axis of the substrate holder by 50 mm. The evaporation source is located such that the evaporated substance may be deposited to the portion of the substrate surface behind the bridge, through the mask openings defined at both sides of the bridge. In this case, an evaporation source 25 of Cr is placed at a position which is H (160 mm) below the surface of rotation of the substrate and L (70 mm) apart from the axis of rotation. When this rotating evaporation method is used, the intended effect is achieved by locating the evaporation source outside of a three-dimensional body which is formed, when the bridge 45 of the mask is placed on the center O of axis of rotation, by the lines connecting the center O on the rotation surface and respective edges of the bridge. In FIG. 5, the breadth of the bridge 45 is shown by a line B—B. In order to sufficiently recover the portion of the pattern which are hidden behind the bridges, it is preferred that the lines connecting the two mask openings defined at both sides of respective bridges extend in the same direction. The maximum allowable angular deviation of these lines for obtaining an acceptable result is about 30°, although it depends on the form of the pattern. The angles formed between the line connecting two evaporation sources which are in symmetry with respect to the bridge or the line between the evaporation source and the imaginary equivalent evaporation source, and the aforementioned lines connecting two mask openings at respective sides of the bridges are maintained smaller than 30°.

The substrate is continuously rotated at a speed of 10 r.p.m., successively assuming the positions as denoted by numerals 41,42,43 and 44. Alternatively, the substrate is rotated intermittently by 180° at each time, so as to take alternatingly the position of, for example, 41 and 43. When the rotation is made intermittently, the evaporation is suspended during the rotation, and is started again as the substrate is stopped at the next position.

Thus, a better recovery of the pattern at portions behind respective bridges is obtained when the evaporation is effected under such a condition that the line connecting the evaporation sources as viewed from a stationary point extends substantially in the same directions as the lines by which the mask openings defined at both sides of respective bridges are connected. It is possible to provide a shutter or another mask between the substrate which rotates continuously and the evaporation sources, such that the shutter or another mask opens at each 180° rotation of the substrate. In this case, however, the efficiency of deposition is considerably lower.

According to the pattern producing method of the invention, a slight difference is caused between the pattern widths in the X and Y directions. More specifically, while the pattern width of the line extending in the X—X' direction in FIG. 2 is substantially equal to the width of the corresponding mask opening line, the pattern width of the line extending in the Y—Y' direction becomes somewhat larger than that of the corresponding mask opening line. It is therefore necessary to design the thickness of the spacer and the position of the evaporation source, taking the above-explained phenomenon into account, in accordance with the required precision of the pattern production.

Figure 6:
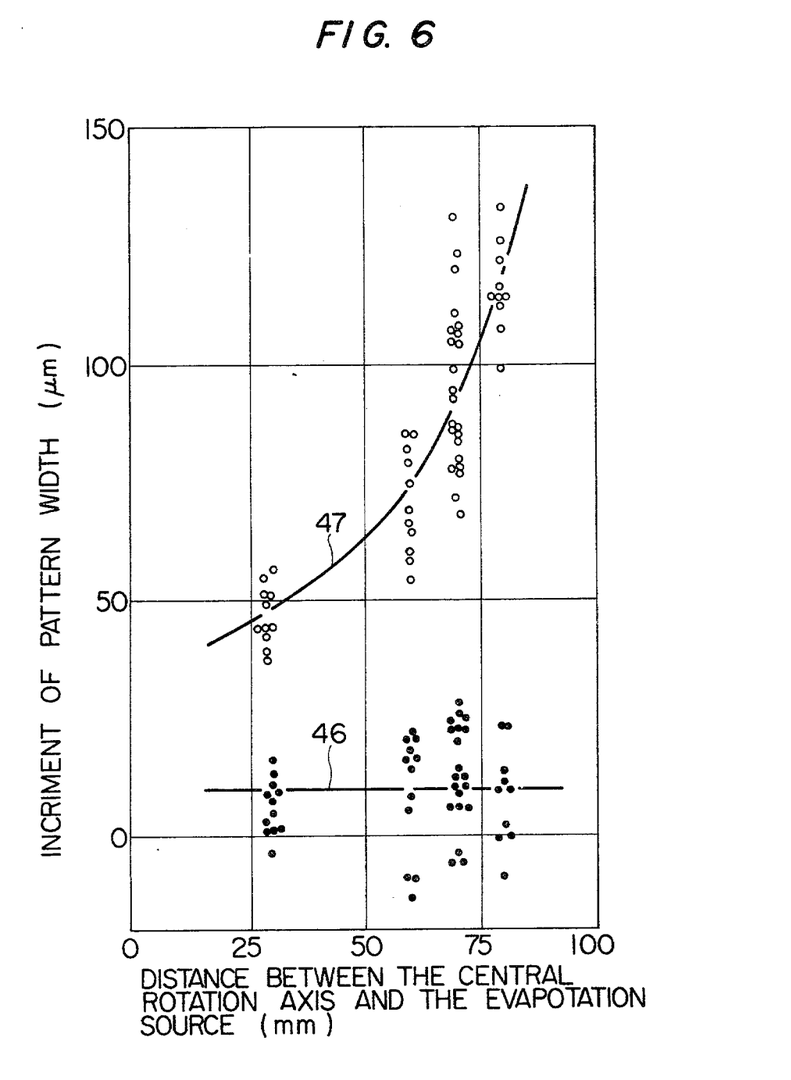
FIG. 6 shows the increment of pattern width in relation to the distance between evaporation source and axis of rotation of substrate.

FIG. 6 shows the increments of the pattern width of the lines extending in X—X' and Y—Y' directions, in relation to the distance L between the rotation axis and the evaporation source.

The increment of the pattern width of lines extending in X—X' and Y—Y' directions are represented, respectively, by curves 46 and 47. In this embodiment, the pattern width of the line extending in the X—X' direction is substantially equal to the width of the mask opening. In other words, the pattern width in the X—X' direction is substantially equal to that of the mask. On the contrary, the pattern width of the line extending in the Y—Y' direction is somewhat larger than that of mask.

Figure 7:
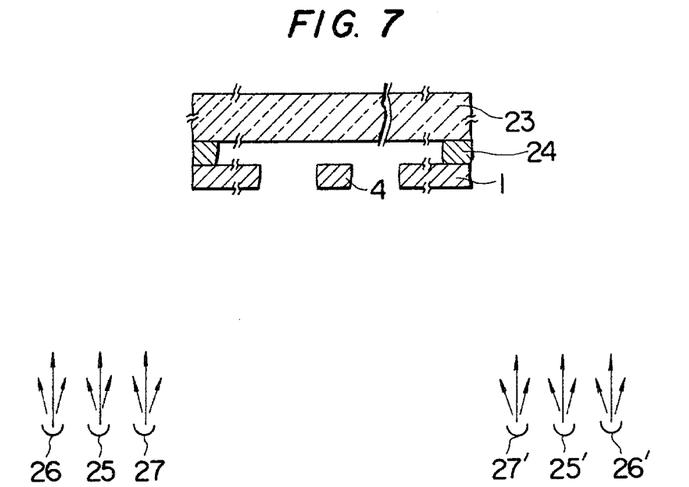
FIG. 7 is an illustration of a model for explaining the evaporation method of the invention for producing wire conductor having a double-layer structure.
Figures 8, 9A:
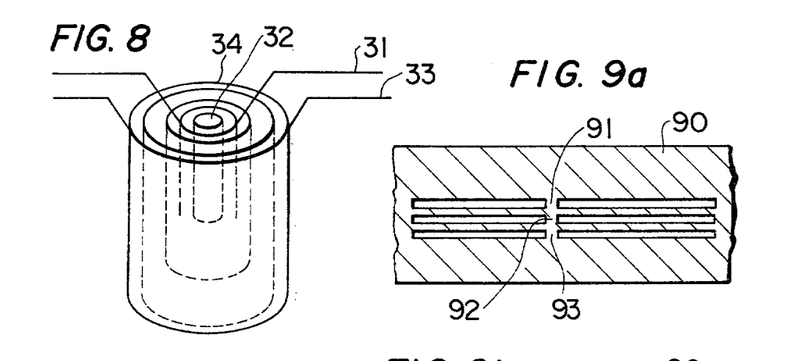
FIG. 8 is a perspective view of an example of the construction of the evaporation source.
FIGS. 9a,9b and 9c show plan views of examples of masks for different patterns.

From a practical point of view, the following ranges of dimensions are recommended.
* level of evaporation source from rotation surface of substrate: H=50 to 500 mm
* distance between axis of rotation to substrate: L=30 to 200 mm
* distance between axis of rotation to evaporation source: L=20 mm to 200 mm The pattern production method of the invention can conveniently be used for the production of a multi-layered film made of different materials. In this case, it is possible to adjust the pulse widths of respective evaporated films, by making use of a single mask, through suitably selecting the positions of the evaporation sources. A process of evaporation of a double-layered structure will be described hereinunder, by way of example. In this case, the second layer is made to have a smaller pattern width than the first layer formed beneath the second layer. This is achieved by arranging such that, as shown in FIG. 7, the evaporation source 25(25') for forming the second film is disposed between the evaporation sources 26(26') and 27(27') for forming the first film. More specifically, these evaporation sources are located 160 mm below the rotation surface. The evaporation sources 25 (25'),26(26') and 27(27') are positioned, respectively, 65 mm, 90 mm and 40 mm apart from the rotation axis. An equivalent effect is obtained by arranging such that, as shown in FIG. 8, the evaporation source for the second film is surrounded by the evaporation source for the first film. In FIG. 8, reference numeral 31 denotes an evaporation source heater for forming the film of first layer. The substance to be evaporated is stored in a member 32. An evaporation source heater for the film of second layer is designated at numeral 33. A member 34 is adapted to be charged with the substance to be evaporated by the heater 33. Also, an equivalent effect can be obtained by making use of the evaporation sources 26,27,25 as shown in FIG. 7, through rotating the substance together with the mask by 180°, because, as a result of the rotation of the substrate and the mask, the evaporation sources 26,27 and 25 come to assume the same position as the evaporation sources 26',27' and 25' relatively to the substrate. Further, the same pattern can be formed by at first effecting the formation of the first film by the evaporation sources 26,26', effecting the formation of the same film by the same evaporation sources 26,26' at a 180° rotated position of the substrate, effecting the formation of the second film on the first film at the same position of the substrate by means of the evaporation sources 25,25' and then finishing the formation of the second film by the same evaporation sources 25,25' at a further 180° rotated position, i.e. the starting position of the substrate.

Thus, the method of the invention is quite effective in the production of multi-layered patterns, particularly when the difference of pattern widths between the layers is of a substantial significance. This feature can advantageously be utilized in the production of wiring conductors such as Cr-Au, NiCr-Au, Ti-Au and the like, in which the underlying film such as Cr, NiCr, Ti and so forth has to have a larger pattern width than the overlying film of Au. To the contrary, when the overlying film is provided for protecting the underlying film, the underlying film has to have a smaller pattern width than the overlying film. It is advantageous that the method of the invention can satisfactorily cope with these demands, through the control of the pattern widths of respective films by effecting the evaporation from a plurality of evaporation sources, while rotating the substrate. Needless to say, electron beam, laser or the like heating measures can be used in general for heating the evaporation source.

Figures 9B, 9C:
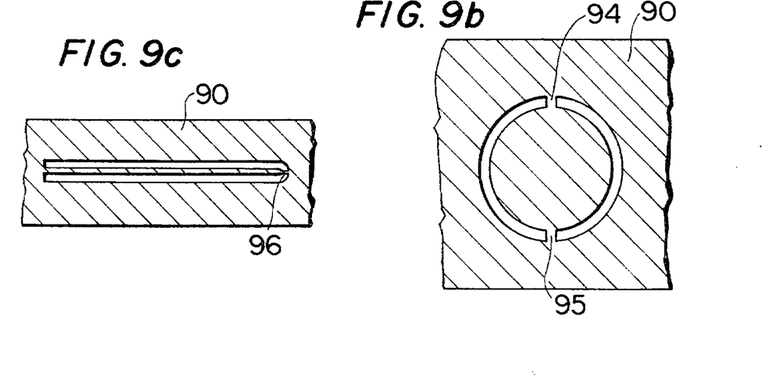

Examples of the masks corresponding to the patterns as shown in FIGS. 1a,1c and 1d are shown, respectively, in FIGS. 9a,9b and 9c. In these Figures, the mask member is designated at reference numeral 90, while reference numerals 91 to 96 denote bridges of respective patterns. The illustrated positions of bridges are not exclusive. In case that there are a plurality of bridges, the lines connecting the mask openings defined at both sides of respective bridges preferably extend in the same direction, as stated before.

Hereinafter, an example of application of the pattern production method to an actual commercial product will be described. In this example, the pattern production method of the invention is used in the formation of wiring on the substrate of a single tube color camera. Before turning to the description of the method, an explanation will be made briefly as to the construction of the substrate of the single tube color camera.

Figure 10:
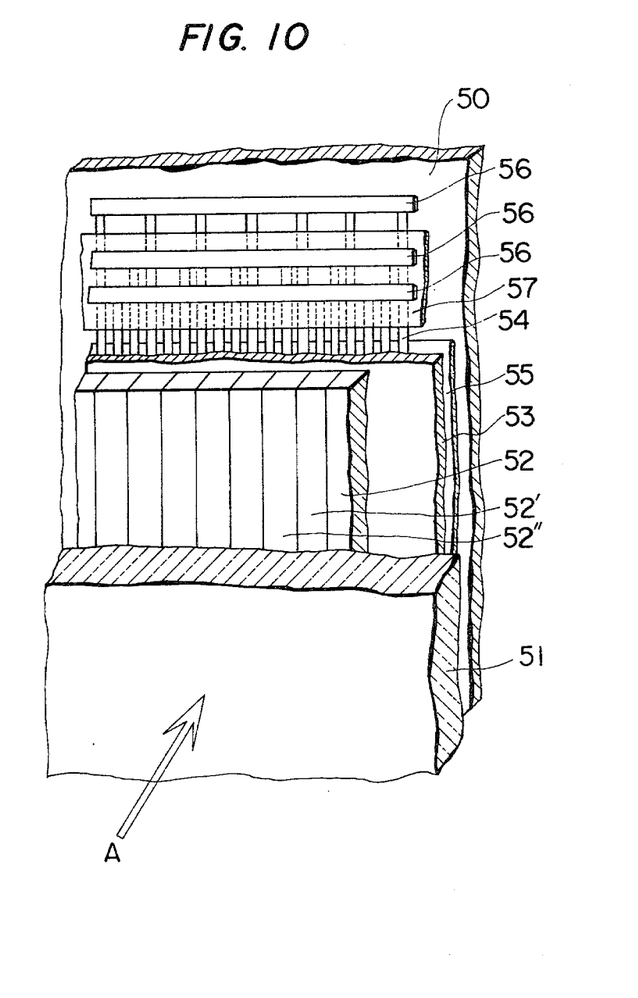
FIG. 10 is a perspective view of the substrate structure of a single tube color camera to which the present invention is applied.

FIG. 10 is a three-dimensional exploded view of the substrate of a single tube color camera. The light coming from the lens is represented by an arrow A. The light is made to pass through a filter plate 51 and is color-decomposed by means of stripe filters 52,52',52".

The decomposed light then passes through an electrode wiring substrate 53 made of glass and a striped transparent conductive film 54, and finally reaches a photoconductive film 55. Meanwhile, the photoconductive film 55 receives an electron beam which comes from the opposite direction to the direction of the light, so that a signal corresponding to the quantity of light appears in the striped transparent conductive film 54. Since this signal represents the quantity of the light decomposed by the stripe filters 52,52',52'', it is possible to take out a signal corresponding to red, blue or green from each stripe of the striped conductive film 54, if the stripe filter consists of color-decomposing filters for three kinds of colors of red, blue and green.

Figure 11:
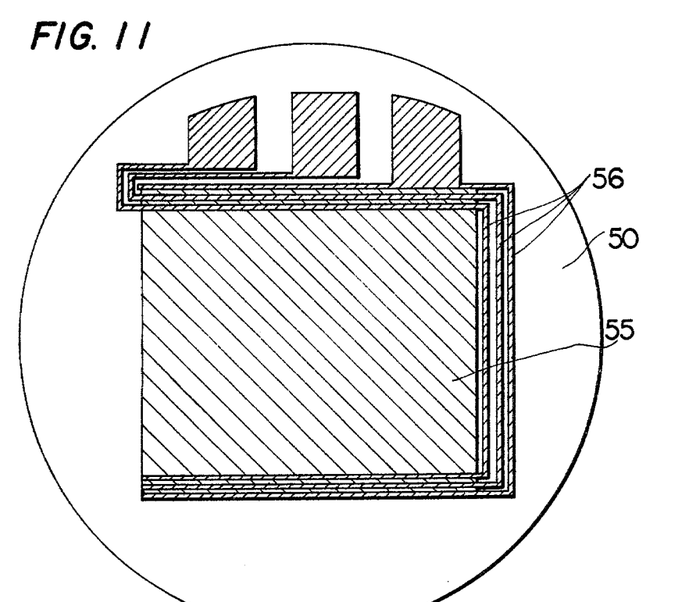
FIG. 11 is a plan view of a target (face plate) of the substrate as shown in FIG. 10.

In addition, as shown in the Figure, there is provided wiring conductors 56 for taking out respective one of the three color signals. The insulation between these three signals is performed by an insulating layer 57. FIG. 11 shows the substrate as viewed from the target side. The electrode wiring substrate 50 is observed as if it is covered by the photoconductive film 55. Three wiring conductors 56 for red, blue and green are arranged in the form of lines surrounding the target surface on which the photoconductive film 55 is provided. At portions above and below the photoconductive film 55 as viewed in the figure, there are double-layered wiring consisting of the striped transparent conductive film and the wiring conductors 56. The wiring conductors 56 have pattern widths of 100 to 150 $\mu$m and the lengths of each side of these conductors are 10 to 13 mm. Therefore, if the mask for forming these wiring conductors 56 is formed to have a mask pattern strictly identical to the pattern of these conductors, the mask cannot support itself because the pitch of the wiring conductors 56 is too small.

Figure 12:
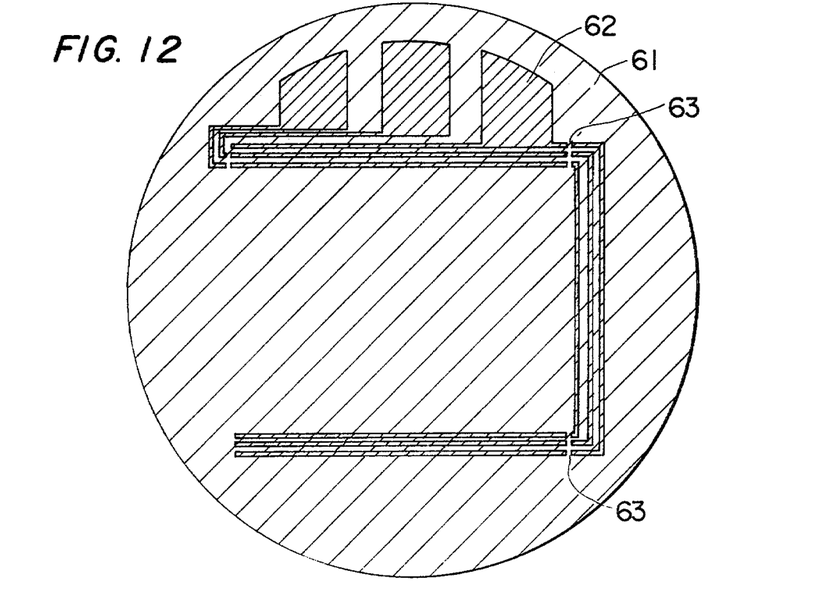
FIG. 12 is a plan view of an evaporation mask.
Figure 13:
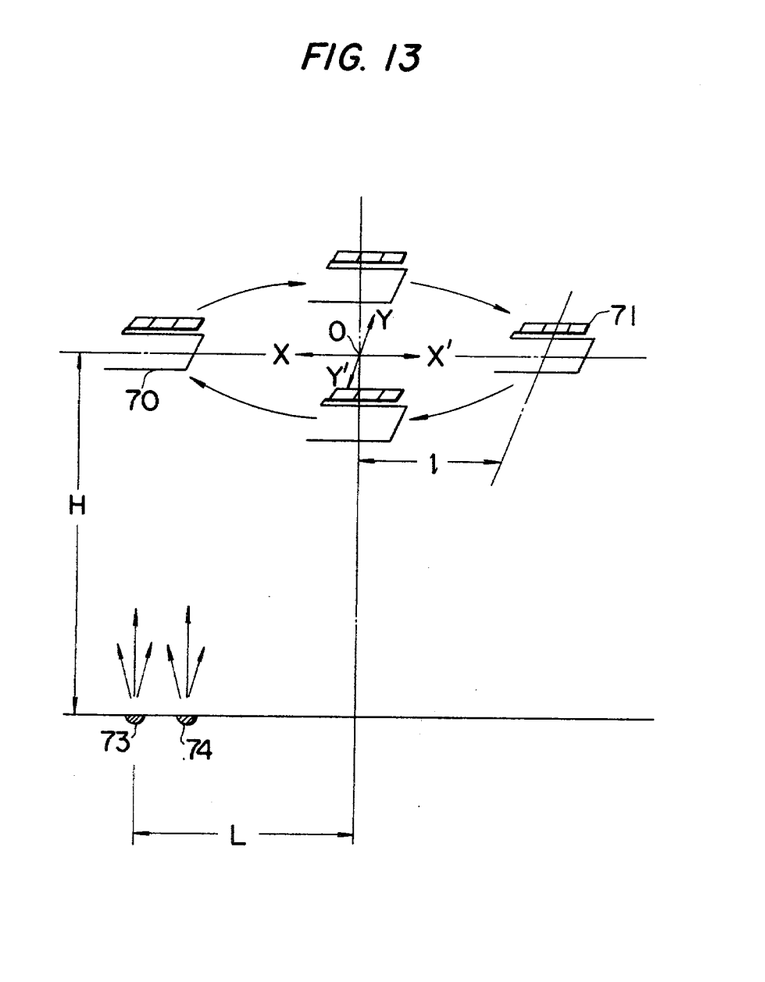
FIG. 13 is an illustration explanatory of a method for producing the above-mentioned wiring by evaporation technique.

According to the invention, a mask as shown in FIG. 12 is used for the production of the patterns of these wiring conductors. In FIG. 12, reference numerals 61, 62 and 63 denote, respectively, a mask material made of molybdenum having a thickness of 80 mm, an opening formed in the mask and bridges formed in the mask. The width of the opening corresponding to the width of the line pattern of each wiring conductor 56 is selected to be 120 $\mu$m, while the breadth of each bridge is selected to be 50 $\mu$m. An electrode wiring substrate of 29 mm dia. is used. The substrate is fixedly held by a substrate holder, together with the mask which is aligned with the substrate with spacers of 80 $\mu$m interposed therebetween. A model of the evaporation method is shown at FIG. 13.

The substrate is mounted on the substrate holder which is adapted to be rotated around a center O. The substrate is orientated such that the line along which the evaporation sources 73,74 are aligned extends in the same direction as the lines connecting the mask openings defined at both sides of respective bridges. The evaporation source 73 is for evaporation of Cr, while the evaporation source 74 is for Au.

The distance l between the substrate and the axis of rotation, distance H between the evaporation source and rotation surface of the substrate are, respectively, 50 mm and 160 mm. And the distance L between the axis of rotation and the two evaporation sources are 95 mm and 80 mm, respectively. The system to be processed by the evaporation is placed in a bell jar, as in the conventional evaporation system. The system is evacuated substantially to $1\times 10^{-6}$ to $5\times 10^{-6}$ Torr.

At first, Cr is evaporated from the evaporation source 73, while the substrate is positioned at the position denoted by a numeral 70. Then, the substrate is rotated by 180° in the direction of the arrow to the position denoted by 71, and is kept stationary at that position 71. Then, the evaporation of Cr is effected again by the same evaporation source 73. Subsequently, while the substrate is kept stationary at the position 71, Au is evaporated from the evaporation source 74. Then, the substrate is rotated again by 180° in the direction of arrow to the starting position 70, and, while the substrate is kept stationary at the position 70, evaporation of Au is effected by the same evaporation source 74. The positions 70 and 71 which are spaced by 180° from each other are selected such that the line along which the evaporation sources are aligned extends in the same direction as the lines interconnecting respective mask openings defined at both sides of respective bridges in the mask.

Consequently, wiring conductors as shown in FIG. 11 are formed. The pattern widths of the lines extending in the Y—Y' direction are somewhat spread or stretched, while the pattern widths of the lines extending in the X—X' direction are substantially equal to those of the corresponding opening in the mask. Thus, there is a directivity in the increment of the pattern width.

In the wiring as shown in FIG. 11, as stated before, three lines extending at each of upper and lower portions are of double-layered wiring construction. Thus, the pattern widths of these double-layered wiring constructions are closely related to the capacitance between adjacent ones of the three wiring lines. Namely, the capacitance between adjacent wiring lines is increased as the pattern widths of these lines become larger. In case of a camera tube, this increment of the capacitance inconveniently incurs an increment of the crosstalk of colors, as well as noises.

According to the invention, this problem is fairly overcome, thanks to the aforementioned directivity in the increment of the pattern width. Namely, according to the invention, the above-mentioned directivity is utilized such that the increment of the pattern width of the lines formed by the evaporation through mask is suppressed as much as possible at the double-layered portions of these lines, while the increment of pulse widths is allowed at other portions of these lines.

At the same time, it is remarkable that the wiring conductors as shown in FIG. 11 can be formed through only one evacuating operation.

In order to ensure that the evaporated substance comes into the spaces behind the bridges to deposit to the substrate surface under these bridges, so as to form complete lines having no discontinuity, it is necessary to carefully select various factors such as width of the bridges, thickness of the spacers, and positional relation between the evaporation source and the substrate.

Figure 14:
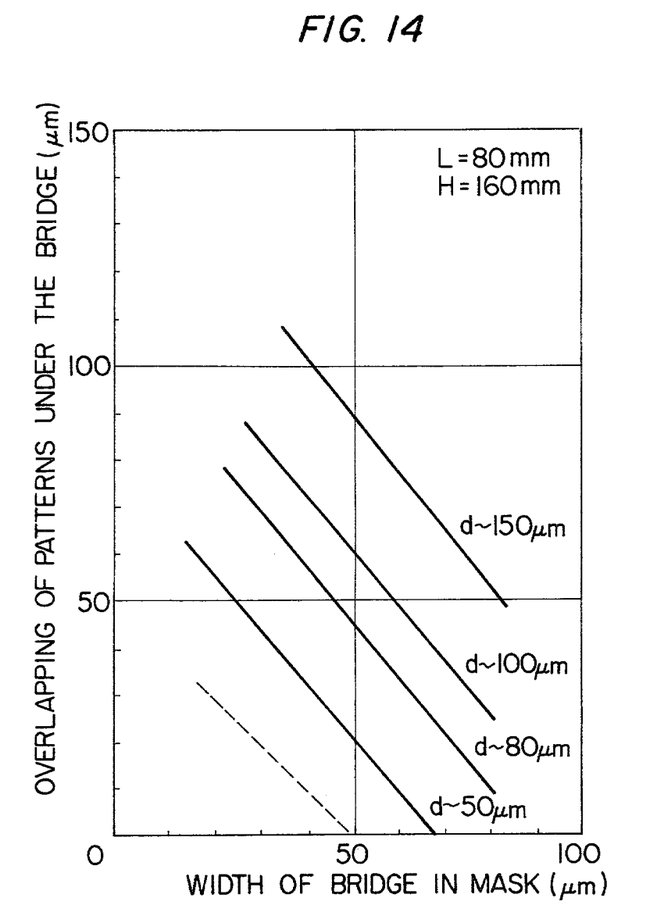
FIG. 14 shows a relation between the breadth of the bridge formed in the mask and the amount of overlap of pattern behind the bridge.

FIG. 14 examplarily shows the relationship between these factors. Full-line curves in the graph of FIG. 14 show the relation between the width of bridge and the overlapping of the pattern under the bridge, with a parameter of thickness d of the spacers, obtained when the distance L between the rotation axis and the evaporation source and the distance H between the rotation surface and the evaporation source are, respectively, 80 mm and 160 mm. Also, the relation between overlapping and bridge width as obtained when L is 40 mm is shown by the broken line curve. The graph shows that the portions of the line pattern behind the bridges are successfully recovered when the overlapping takes a positive value. The overlapping becomes smaller as the width of the bridge is increased and as the thickness of the spacers is reduced. These factors are suitably selected in accordance with the nature of the pattern to be formed.

What is claimed is:

1. A method of producing material patterns on a substrate, by deposition of the material in evaporated form through a perforated mask onto the substrate surface, said perforated mask having at least one opening, which at least one opening corresponds to said material patterns, and at least one reinforcing bridge which extends across part of said at least one opening to reinforce said mask, characterized in that during the deposition said perforated mask is spaced from the substrate surface, and further characterized in that the step of depositing the material includes orienting the mask-substrate combination, relative to at least one evaporation source, such that the material is evaporated onto the substrate from at least two different directions chosen so that no gap is left in the material deposited on the substrate surface beneath the at least one reinforcing bridge after the deposition, whereby said material patterns, having no gap on the substrate surface beneath the at least one reinforcing bridge, are formed.

2. A method of producing material patterns according to claim 1, characterized in that the substrate and mask are rotated about an axis of rotation, thereby moving the substrate and mask with respect to at least one evaporation source so as to provide said different directions of evaporation by providing different relative locations of the at least one evaporation source vis-a-vis the mask-substrate combination.

3. A method of producing material patterns according to claim 2, characterized in that one evaporation source is provided, and in that the substrate and mask are rotated with respect to the one evaporation source such that two different directions of evaporation are provided.

4. A method of producing material patterns according to claim 1, characterized in that there are at least two spaced evaporation sources respectively providing said different directions of evaporation.

5. A method of producing material patterns according to claim 4, characterized in that there are two spaced evaporation sources which provide two different directions of evaporation.

6. A method of producing material patterns according to claim 2 or 3, characterized in that the direction of a line interconnecting the openings defined at both sides of respective bridges is at an angle of not more than 30° to the straight line connecting two relative locations of the evaporation source.

7. A method of producing material patterns according to claim 4 or 5, characterized in that the direction of a line interconnecting the openings defined at both sides of respective bridges is at an angle of not more than 30° to the straight line connecting two evaporation sources.

8. A method of producing material patterns according to claims 2, 3 or 6, characterized in that the evaporation source is 20 mm to 200 mm from the axis of rotation, the distance between the axis of rotation and the substrate is 30 to 200 mm, and the distance between evaporation source and the rotation surface of the substrate is 50 to 500 mm.

9. A method of producing material patterns according to claim 2, characterized in that the rotation of the substrate and mask is intermittent, evaporation being effected while the substrate is held stationary relative to the evaporation source at predetermined positions in its rotation.

10. A method of producing material patterns according to claim 6, characterized in that the rotation of the substrate and mask is intermittent, evaporation being effected while the substrate is held stationary relative to the evaporation source at predetermined positions in its rotation.

11. A method of producing material patterns according to claim 1, characterized in that a plurality of spaced evaporation sources is used for evaporation of at least two different substances and that each substance is evaporated onto the substrate from at least two different directions chosen so that no gap is left in the material deposited on the substrate surface beneath the bridge or bridges.

12. A method of producing material patterns according to claim 6, characterized in that a plurality of spaced evaporation sources is used for evaporation of at least two different substances and that each substance is evaporated onto the substrate from at least two different directions chosen so that no gap is left in the material deposited on the substrate surface beneath the bridge or bridges.

13. A method of producing material patterns according to claim 7, characterized in that a plurality of spaced evaporation sources is used for evaporation of at least two different substances and that each substance is evaporated onto the substrate from at least two different directions chosen so that no gap is left in the material deposited on the substrate surface beneath the bridge or bridges.

14. A method of producing material patterns according to claim 1, characterized in that the lines extending in the directions of the openings on either side of each bridge extend substantially in the same direction.

15. A method of producing material patterns according to claim 1, characterized in that the lines extending in the directions of the openings on either side of each bridge extend in directions which deviate at most 30° from each other.

16. A method of producing material patterns according to claim 1, characterized in that the mask is substantially planar, and the one or more reinforcing bridges extend in the same plane as the remainder of said mask.

17. A method of producing material patterns according to claim 1, wherein a plurality of evaporation sources are disposed such that the line interconnecting evaporation sources which provide material evaporated from at least two different directions makes an angle not greater than 30° to the lines interconnecting pattern openings defined at both sides of respective bridges.

* * * * *